United States Patent
Wei et al.

(10) Patent No.: US 7,781,834 B2
(45) Date of Patent: Aug. 24, 2010

(54) ROBUST ESD LDMOS DEVICE

(75) Inventors: Chi-San Wei, Hsin-Chu (TW);
Kuo-Ming Wu, Hsin-Chu (TW);
Jian-Hsing Lee, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/773,364

(22) Filed: Jul. 3, 2007

(65) Prior Publication Data
US 2009/0008710 A1    Jan. 8, 2009

(51) Int. Cl.
*H01L 29/78* (2006.01)
*H01L 29/10* (2006.01)

(52) U.S. Cl. .................. 257/343; 257/340; 257/341; 257/409; 257/E29.066; 257/E29.256; 257/E29.258

(58) Field of Classification Search .......... 257/340, 257/341, 343, 409, E29.066, E29.256, E29.258
See application file for complete search history.

(56) References Cited

U.S. PATENT DOCUMENTS

| 2006/0071273 | A1 | 4/2006 | Hiroki |
| 2007/0278568 | A1* | 12/2007 | Williams et al. ............ 257/335 |
| 2008/0006875 | A1* | 1/2008 | Ohtsuka et al. ............ 257/341 |

FOREIGN PATENT DOCUMENTS

| CN | 1755944 A | 4/2006 |
| CN | 1841741 A | 10/2006 |

* cited by examiner

*Primary Examiner*—Victor A Mandala
(74) *Attorney, Agent, or Firm*—Slater & Matsil, L.L.P.

(57) ABSTRACT

A semiconductor device includes a gate electrode over a semiconductor substrate, wherein the gate electrode has a gate width direction; a source/drain region in the semiconductor substrate and adjacent the gate electrode, wherein the source/drain region has a first width in a direction parallel to the gate width direction; and a bulk pick-up region in the semiconductor substrate and abutting the source/drain region. The bulk pick-up region and the source/drain region have opposite conductivity types. The bulk pick-up region has a second width in the width direction, and wherein the second width is substantially less than the first width.

18 Claims, 8 Drawing Sheets

ROBUST ESD LDMOS DEVICE

TECHNICAL FIELD

This invention relates generally to semiconductor devices, and more particularly to structures and formation methods of lateral diffused metal-oxide-semiconductor (LDMOS) devices.

BACKGROUND

Lateral diffused metal-oxide-semiconductor (LDMOS) devices are widely used for many types of applications, such as high voltage applications. An LDMOS device typically includes a lightly doped drain region to enhance the breakdown voltage.

FIG. 1 illustrates a cross-sectional view of conventional LDMOS devices 2 and 4, which are formed adjacent to each other, with source regions 6 and 8 therebetween. Heavily doped p-type (P+) bulk pick-up region 10 separates source regions 6 and 8. Drain regions 12 are spaced apart from the respective gate electrodes 16 in order to increase drain-gate voltage. Source regions 6 and 8 and drain regions 12 are doped with an n-type impurity. An LDMOS device may include a plurality of legs connected in parallel, and FIG. 1 illustrates one leg of the LDMOS device. Typically gate electrodes 16 of LDMOS devices 2 and 4 are interconnected, and drain regions 12 are interconnected, and thus LDMOS devices 2 and 4 act as a single LDMOS device.

A top view of the structure shown in FIG. 1 is illustrated in FIG. 2. The gate width of gate electrodes 16 is typically long in order for increasing the drive current of the LDMOS device. Source regions 6 and 8 and P+ bulk pick-up region 10 are formed as three parallel strips extending in the gate width direction. The P+ bulk pick-up region 10 adjoins and fully separates source regions 6 and 8. Squares indicated the contacts, which connect metal lines in metallization layers to source regions 6 and 8, P+ bulk pick-up region 10 and drain regions 12.

It is preferred that the conventional LDMOS devices can also act as electrostatic discharge (ESD) devices while at the same time perform the desired LDMOS functionality. However, the electrostatic discharging ability of conventional LDMOS devices is inferior than conventional ESD devices.

Accordingly, the structures and formation methods of LDMOS device need to be changed in order to improve electrostatic discharge abilities of LDMOS devices.

SUMMARY OF THE INVENTION

In accordance with one aspect of the present invention, a semiconductor device includes a semiconductor substrate; a gate electrode over the semiconductor substrate, wherein the gate electrode has a gate width direction; a source/drain region in the semiconductor substrate and adjacent the gate electrode, wherein the source/drain region has a first width in a direction parallel to the gate width direction; and a bulk pick-up region in the semiconductor substrate and abutting the source/drain region. The bulk pick-up region and the source/drain region have opposite conductivity types. The bulk pick-up region has a second width in the width direction, and wherein the second width is substantially less than the first width.

In accordance with another aspect of the present invention, a semiconductor device includes a semiconductor substrate; a first gate electrode over the semiconductor substrate; a second gate electrode over the semiconductor substrate; a common source region between the first and the second gate electrodes; a first bulk pick-up region adjoining the common source region; and a second bulk pick-up region adjoining the common source region, wherein the first and the second bulk pick-up regions are physically spaced apart by a portion of the common source region.

In accordance with yet another aspect of the present invention, a semiconductor device includes a semiconductor substrate; a first gate electrode over the semiconductor substrate; a common source region having an edge substantially aligned to an edge of the first gate electrode; a first drain region on an opposite side of the first gate electrode than the common source region; and a first bulk pick-up region encircled by the common source region, wherein the first bulk pick-up region and the common source region are of opposite conductivity types.

The advantageous features of the present invention include improved electrostatic discharging ability, and reduced chip area usage.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A lateral diffused metal-oxide-semiconductor (LDMOS) device and methods of forming the same are provided. The variations of the preferred embodiments are then discussed. Throughout the various views and illustrative embodiments of the present invention, like reference numbers are used to designate like elements.

Figure 3:
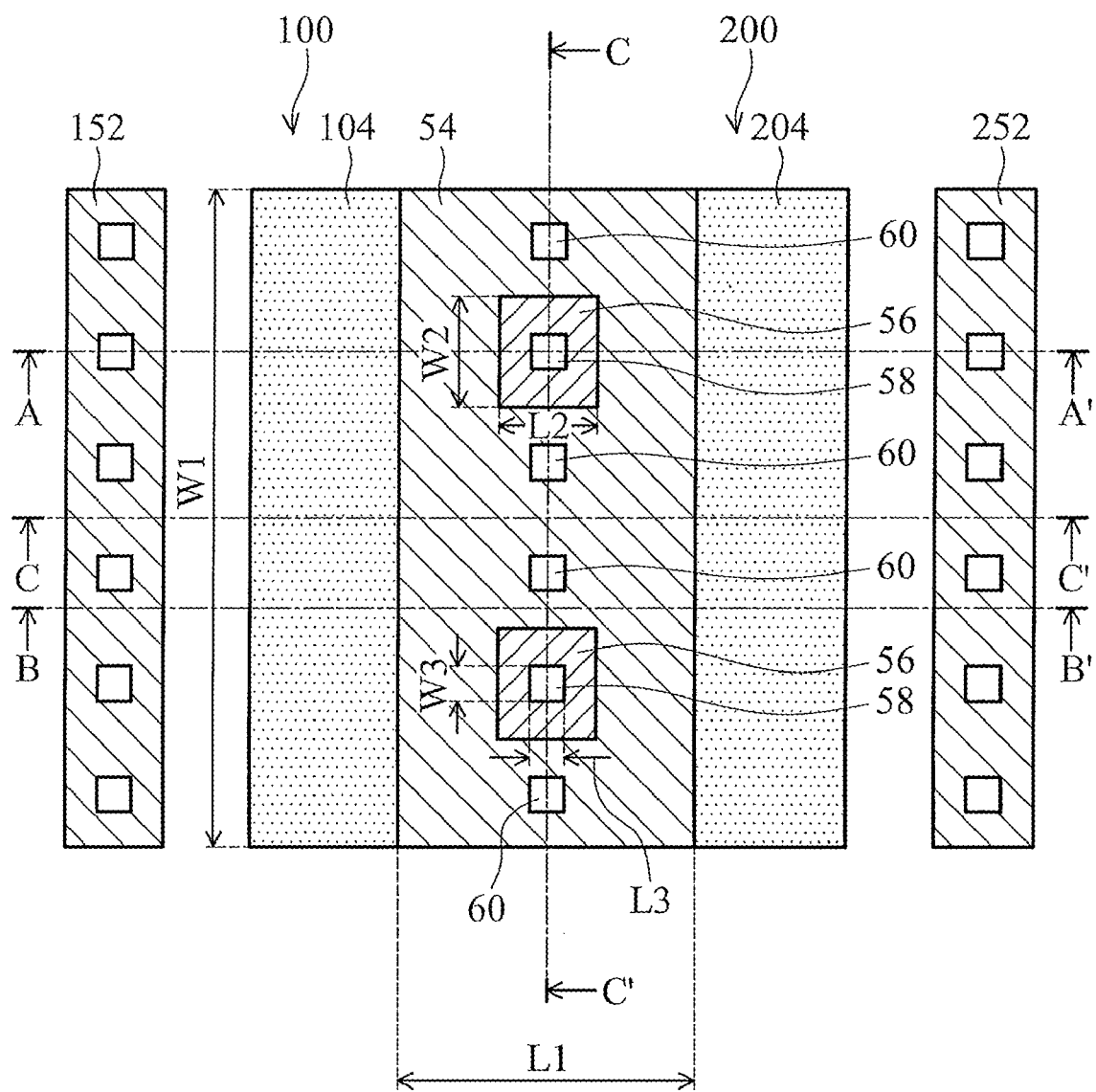
FIG. 3 illustrates a top view of an embodiment of the present invention.

FIG. 3 illustrates a top view of an embodiment of the present invention. N-type LDMOS (LDNMOS) devices 100 and 200 are formed adjacent to each other, and share common source region 54. Gate 104 of LDNMOS device 100 is connected to gate 204 of LDNMOS device 200, preferably through a metal line (not shown) in a metallization layer. Drain region 152 of LDNMOS device 100 is connected to drain region 252 of LDNMOS device 200. Drain regions 152 and 252 are preferably spaced apart from gates 104 and 204, respectively, so that high drain-to-gate voltages can be applied. LDNMOS devices 100 and 200 form a single LDN- MOS device with a high drive current. Preferably, common source region 54 and drain regions 152 and 252 are heavily doped n-type (N+) regions.

Gates 104 and 204 have width W1. Accordingly, the common source region 54 has the width W1. Bulk pick-up regions 56, which are heavily doped p-type (P+) regions, are each encircled by common source region 54. The width W2 of bulk pick-up regions 56 is substantially less than width W1. Contacts 58, which are formed inside inter-level dielectric layer and connect bulk pick-up regions 56 to the overlying metallization layers, are formed over bulk pick-up regions 56.

In an embodiment, only one bulk pick-up region 56 is formed inside common source region 54. Alternatively, more bulk pick-up regions 56 are formed inside common source region 54, and are physically separated from each other by common source region 54. Each of the bulk pick-up regions 56 is electrically connected to the overlying metallization layer by at least one contact 58. In the preferred embodiment, bulk pick-up regions 56 and contacts 58 are substantially symmetric with relative to a central line C-C' separating common source region 54 into two equal parts, so that the currents are evenly distributed. Regardless of the number of bulk pick-up regions 56, the total width of bulk pick-up regions 56 is preferably less than width W1. The width W2 of a single bulk pick-up region 56 is greater than width W3 of contacts 58.

Length L2 of bulk pick-up regions 56 is less than length L1 of common source region 54 and is larger than length L3 of contacts 58.

Common source region 54 is also connected to the overlying metallization layers by contacts 60. In the preferred embodiment, all contacts 60 and contact(s) 58 are in a same column as shown in FIG. 3. Further, all contacts 60 and contacts 58 are connected together through a metal line (not shown). Please note common region 54 is a single interconnected region, although contacts regions 56 are formed therein.

Figure 4A:
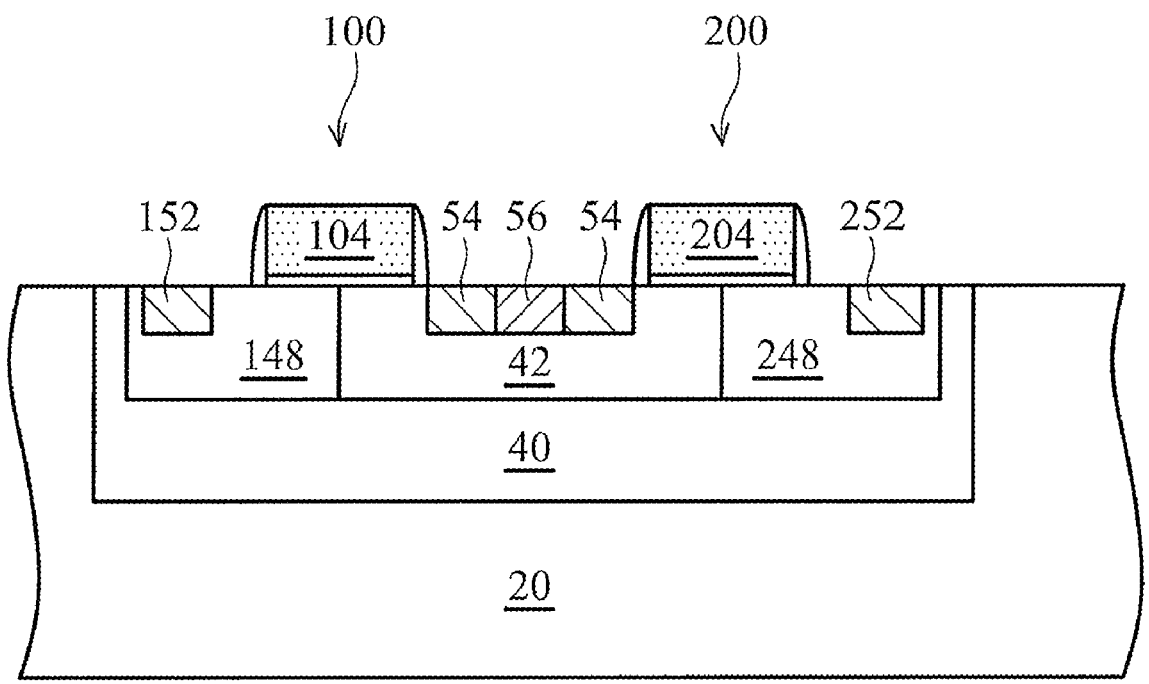
FIGS. 4A and 4B are cross-sectional views of the embodiment shown in FIG. 3.
Figure 4B:
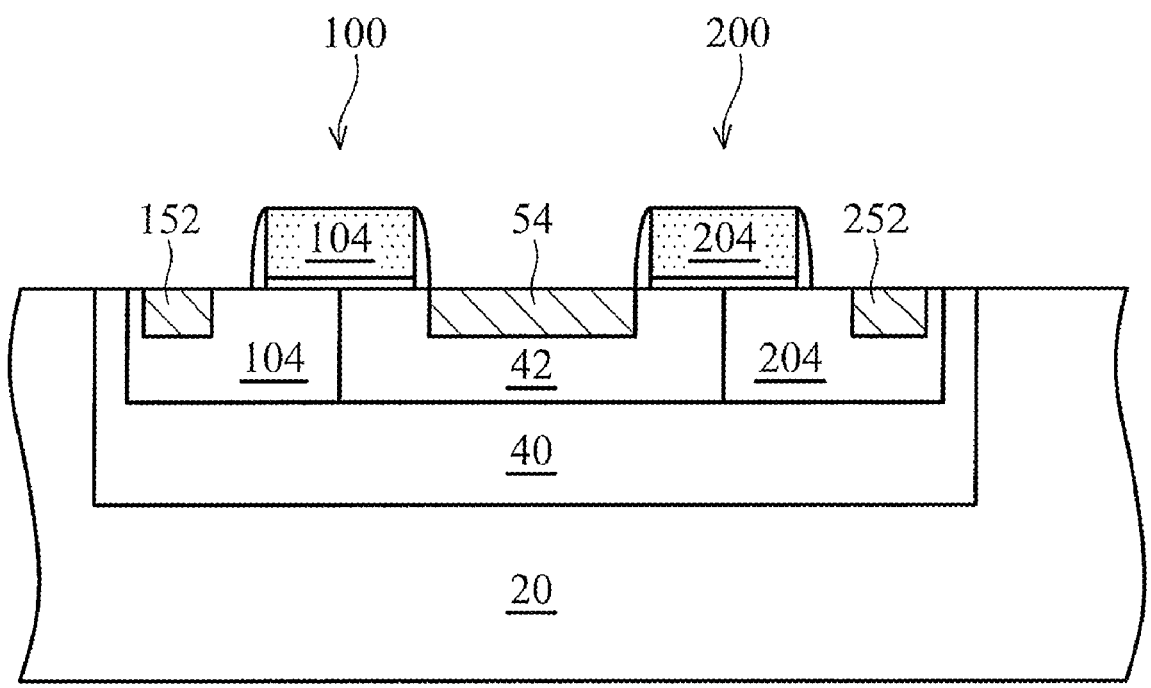

FIGS. 4A and 4B are cross-sectional views of the structure shown in FIG. 3, wherein the cross-sectional views are taken along planes crossing lines A-A' and B-B', respectively. Referring to FIG. 4A, LDMOS devices 100 and 200 are formed at the surface of substrate 20, which is preferably lightly-doped with a p-type impurity. High-voltage n-type well (HVNW) region 40 is formed in substrate 20. Preferably, HVNW region 40 is formed by implanting a top portion of substrate 20 with an n-type impurity, such as phosphorous, arsenic, and the like. Alternatively, HVNW 40 may be formed by growing an epitaxial layer over substrate 20, and implanting the epitaxial layer with an n-type impurity.

P-body 42 and n-diffused drain (NDD) regions 148 and 248 are formed in HVNW region 40, preferably by implanting appropriate p-type and n-type impurities. In a first embodiment, P-body 42 is spaced apart from NDD regions 148 and 248 by portions of HVNW 40. Alternatively, P-body 42 adjoins NDD regions 148 and 248. NDD regions 148 and 248 are also commonly referred to as drift regions. Preferably, they are lightly doped with n-type impurities, although their impurity concentrations are preferably higher than the impurity concentration of HVNW region 40. Heavily doped drain regions 152 and 252 are formed in NDD regions 148 and 248, and are horizontally spaced apart from gates 104 and 204, respectively. In an embodiment, NDD regions 148 and 248 spaces drain regions 152 and 252 apart from the respective gate electrodes 104 and 204. Alternatively, shallow trench isolation regions or field oxides can be formed between drain regions 152 and 252 and the respective gate electrodes 104 and 204. As a result, LDMOS devices 100 and 200 can be applied with increased drain-gate voltages.

In P-body 42, common source region 54 and bulk pick-up regions 56 are preferably abutted. Bulk pick-up regions 56 are each encircled by common source region 54 (also refer to FIG. 3), and thus is horizontally spaced apart from gate electrodes 104 and 204. Preferably, common source region 54 is formed simultaneously with the formation of drain regions 152 and 252.

FIG. 4B is the cross-sectional view of LDMOS devices in a plane crossing line B-B' in FIG. 3. This cross-sectional view is similar to the cross-sectional view shown in FIG. 4A, except the plane does not cross bulk pick-up region 56.

Figure 5A:
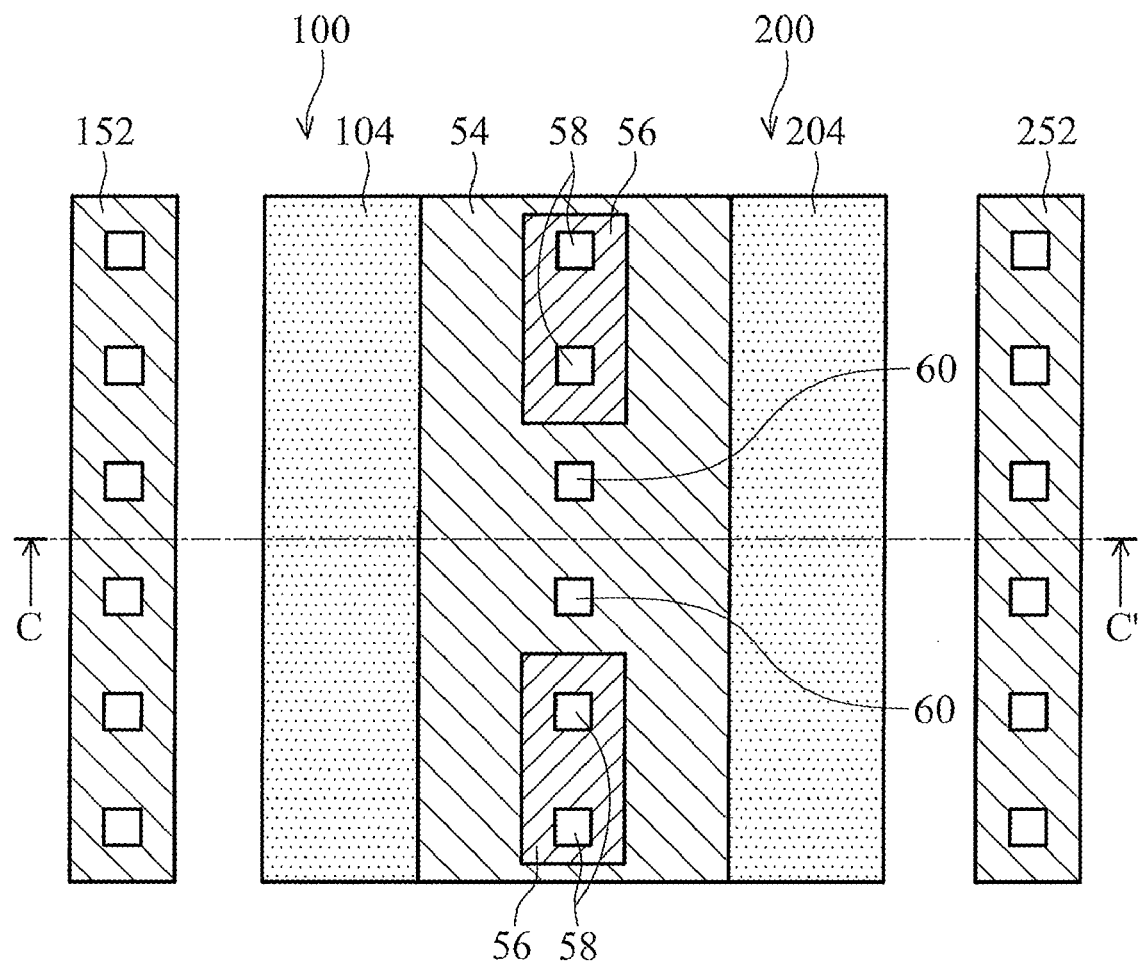
FIGS. 5A and 5B are variations of the preferred embodiment of the present invention.
Figure 5B:
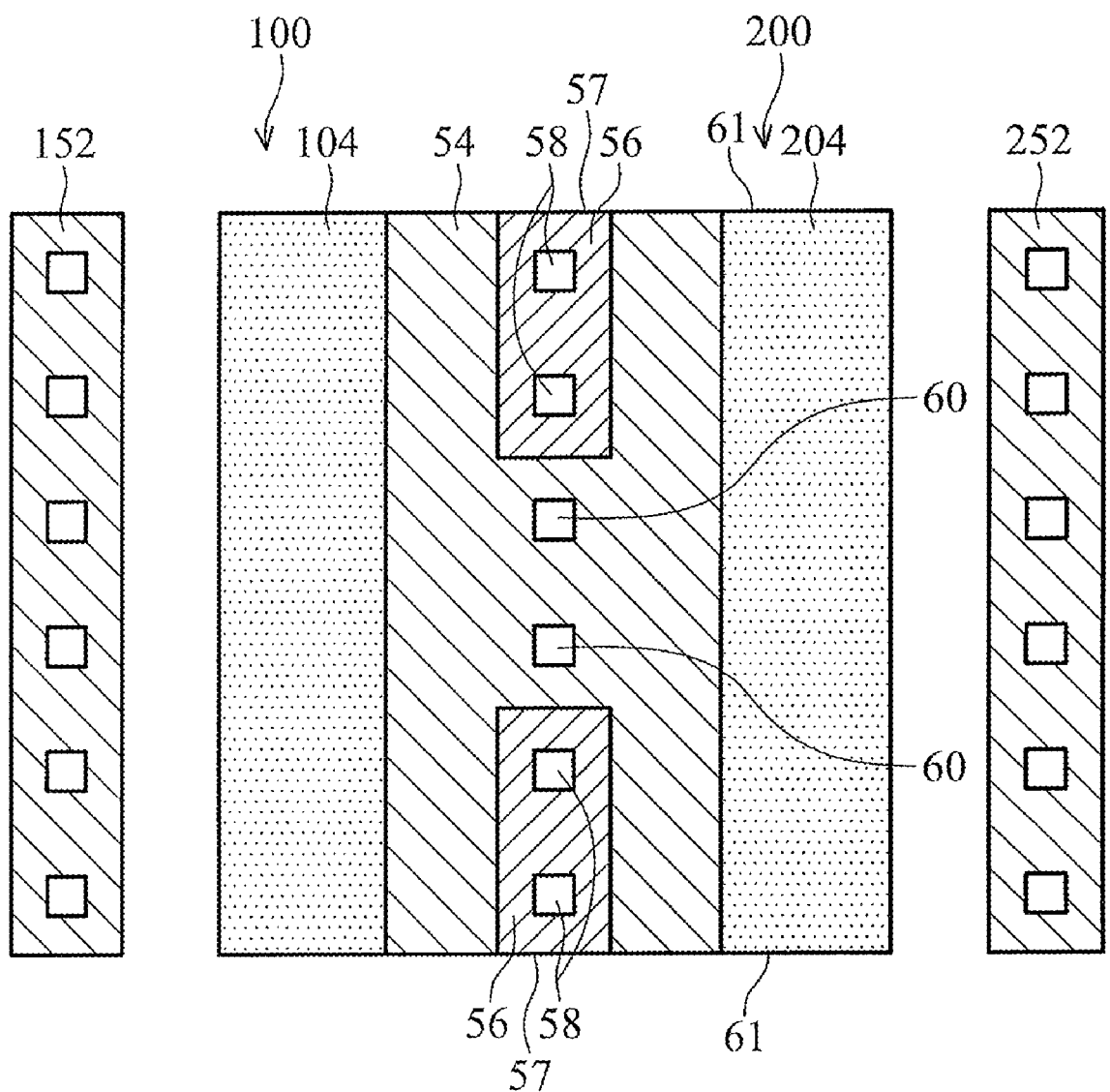

FIGS. 5A and 5B are variation of the embodiments of the present invention. Referring to FIG. 5A, instead of formed as separate bulk pick-up regions with one contact 58 therein, the individual bulk pick-up regions 56 can contain more than one contact 58. If only one bulk pick-up region 56 is formed, it is preferably in the middle portion of common source region 54. Additionally, bulk pick-up regions 56 are preferably symmetrical with relative to center line C-C'. Although FIG. 5A shows each of the bulk pick-up regions 56 being encircled by common source region 54, some or all bulk pick-up regions 56 may have edges overlapping edges of common sources 54. An exemplary embodiment is shown in FIG. 5B, wherein edges 57 of bulk pick-up regions 56 overlaps edges 61 of common source regions 54.

Figure 1:
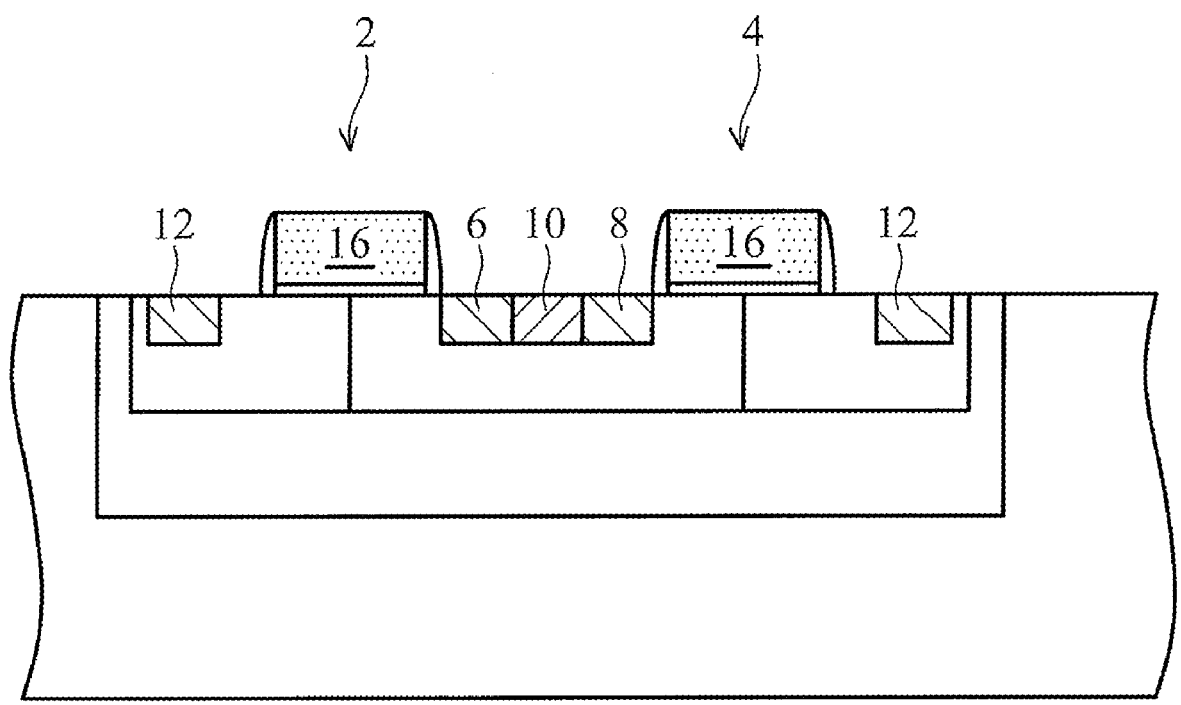
FIG. 1 illustrates a cross-sectional view of conventional lateral-diffused metal-oxide-semiconductor (LDMOS) devices.
Figure 2:
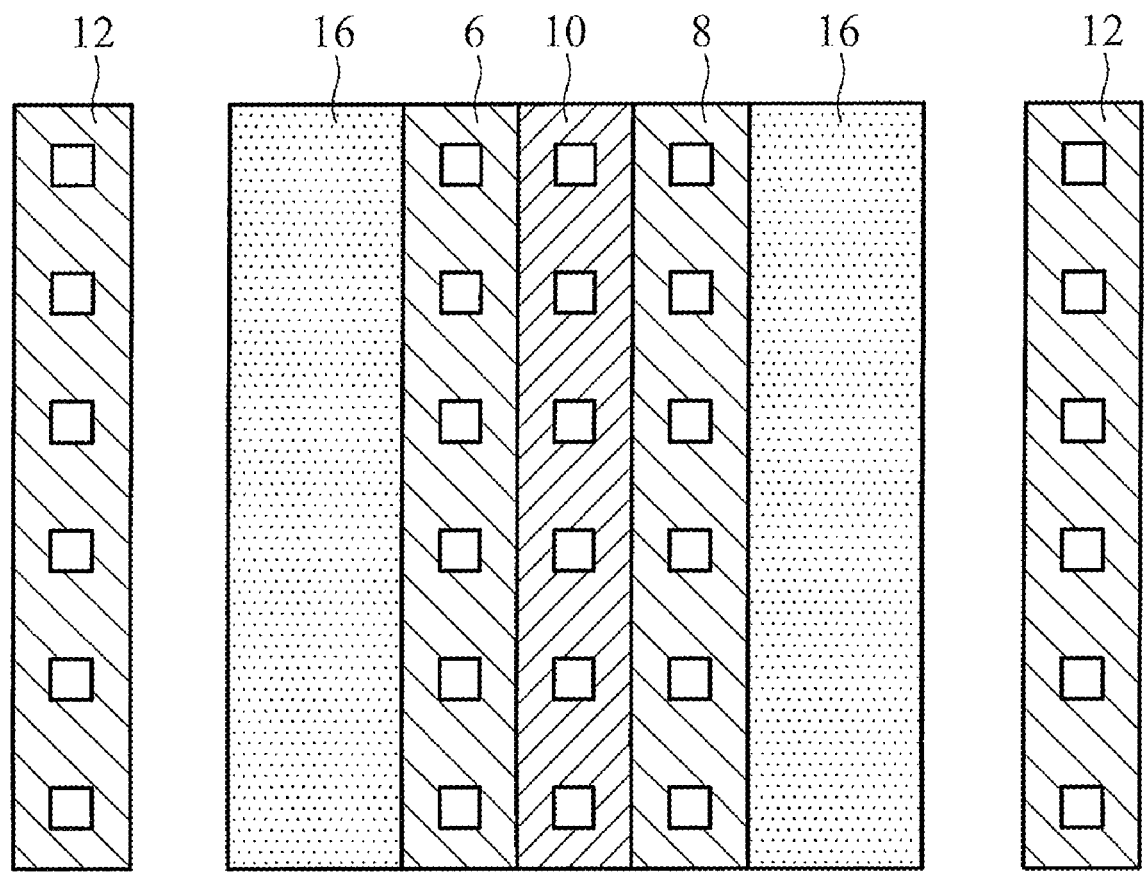
FIG. 2 illustrates a top view of the structure shown in FIG. 1.

An advantageous feature of the present invention is that the area of the LDMOS device can be reduced. Comparing FIGS. 2 and 3, it is noted that the present invention makes it possible to reduce the chip area of LDMOS devices. In FIG. 3, only one column of contacts 58 and 60 needs to be formed, while in conventional LDMOS devices, three columns of contacts need to be formed. Therefore, the chip area for the other two rows of contacts and the corresponding bulk pick-up regions is saved.

Experiments have revealed that the preferred embodiments of the present invention could sustain significantly higher electrostatic voltages at both machine mode and human body mode. Table 1 shows the experiment results.

TABLE 1

| Device | HBM | MM | It2 |
| --- | --- | --- | --- |
| Conventional | 2 kV | 150 V | 1.0 A |
| Embodiments | 7.5 kV | 500 V | 5.2 A |

It is found from Table 1 that in human body mode (HBM), the preferred embodiments of the present invention can sustain a voltage of about 7.5 kV. In machine mode (MM), the preferred embodiments of the present invention can sustain a voltage of about 500V. As a comparison, a conventional LDMOS having two source strips separated by a P+ contact strip can only sustain a HBM voltage of about 2 kV, and a MM voltage of about 150V. In addition, the sustainable current is increased to about 5.2 A as compared to 1.0 A of a conventional LDMOS device.

Figure 6:
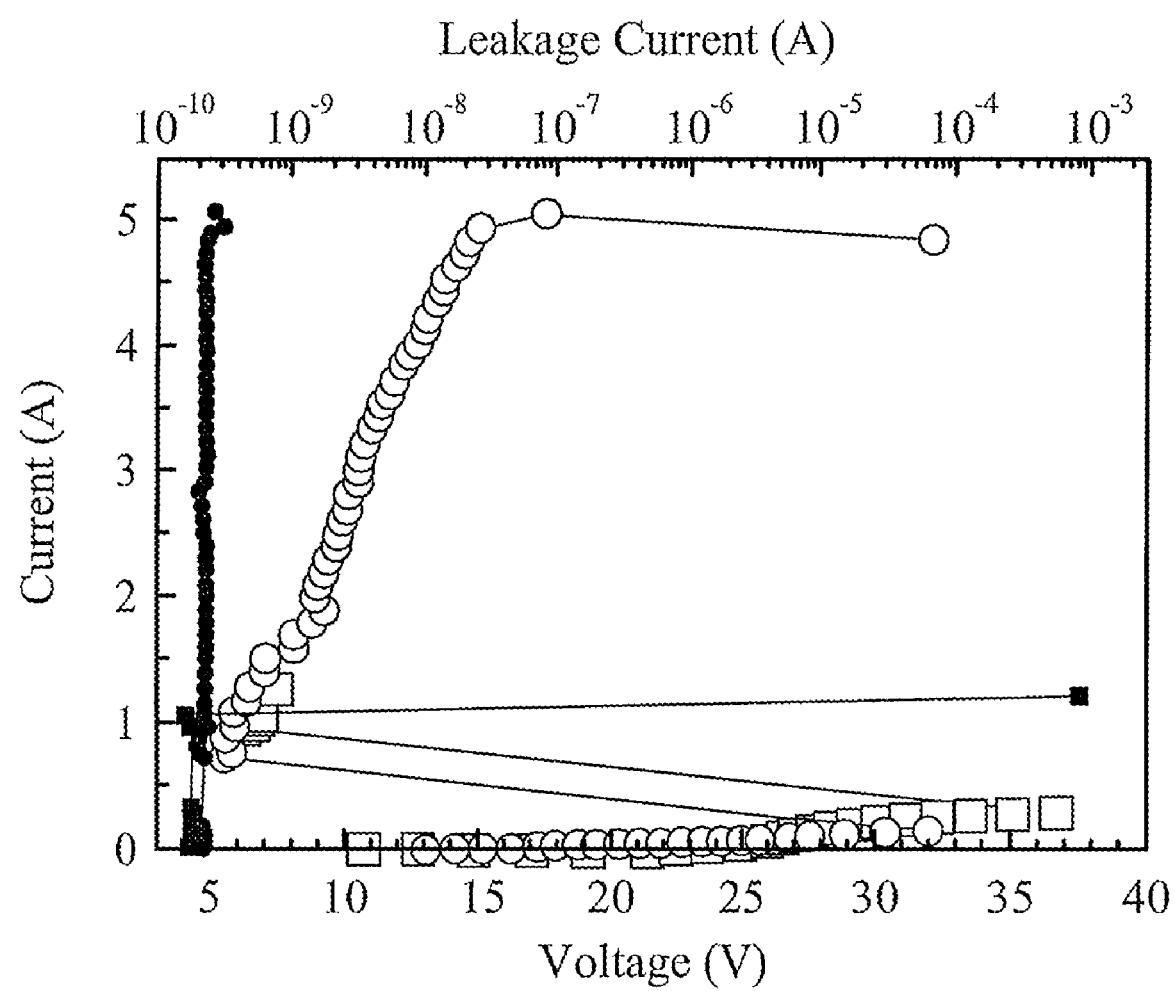
FIG. 6 illustrates experiment results.

FIG. 6 illustrates currents of LDMOS devices as functions of leakage currents and voltages, wherein the embodiments of the present invention and conventional LDMOS devices are compared. Solid circles and solid squares indicate the leakage currents of the embodiments of the present invention and prior art LDMOS devices, respectively, wherein the leakage currents correspond to the X-axis on the top of FIG. 6. It is noted that the drive current of the embodiments of the present invention is about 5.2 A, while the drive current of the convention LDMOS is only about 1.0 A. Hollow circles and hollow squares indicate the results of drain-to-source voltages of the embodiments of the present invention and prior art LDMOS devices, respectively, wherein voltages are shown as the X-axis on the bottom of FIG. 6. It is noted that the snap-back voltage of embodiments of the present invention is about 32V, slightly less than the snap-back voltage of the conventional LDMOS devices, which is about 37V. This is a desired feature for an LDMOS to be used as an ESD device.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
   a semiconductor substrate;
   a gate electrode over the semiconductor substrate, wherein the gate electrode has a gate width direction;
   a source region in the semiconductor substrate and adjacent the gate electrode, wherein the source region has a first width in a direction parallel to the gate width direction;
   a bulk pick-up region in the semiconductor substrate and abutting the source region, wherein the bulk pick-up region has a second conductivity type opposite to a first conductivity type of the source region, and wherein the bulk pick-up region has a second width in the gate width direction, and wherein the second width is substantially less than the first width;
   a drain region on an opposite side of the gate electrode than the source region; and
   an additional gate electrode over the semiconductor substrate, wherein the source region is between the gate electrode and the additional gate electrode, and wherein the gate electrode and the additional gate electrode are electrically connected;
   wherein the source region is in a first well region, and the drain region is in a second well region of an opposite conductivity type than the first well region.

2. The semiconductor device of claim 1, wherein the bulk pick-up region is encircled by the source region.

3. The semiconductor device of claim 1 further comprising a plurality of contacts, wherein the plurality of contacts comprises a first contact connected to the bulk pick-up region, and a second contact connected to the source region, and wherein the plurality of contacts forms a first column in the gate width direction.

4. The semiconductor device of claim 1, wherein the bulk pick-up region is connected to only one contact.

5. The semiconductor device of claim 1 further comprising an additional bulk pick-up region of the second conductivity type abutting the source region, wherein the additional bulk pick-up region is physically separated from the bulk pick-up region by a portion of the source region.

6. The semiconductor device of claim 5, wherein each of the bulk pick-up region and the additional bulk pick-up region is encircled by the source region.

7. The semiconductor device of claim 1, wherein the bulk pick-up region has a width of less than a width of the source region and greater than a width of a contact connected to the bulk pick-up region.

8. The semiconductor device of claim 1, wherein the bulk pick-up region has a length of greater than a length of a contact and less than a length of the source region.

9. A semiconductor device comprising:
   a semiconductor substrate;
   a first gate electrode over the semiconductor substrate;
   a second gate electrode over the semiconductor substrate;
   a common source region formed in a first well region in the semiconductor substrate between the first and the second gate electrodes;
   a first bulk pick-up region adjoining the common source region;
   a second bulk pick-up region adjoining the common source region, wherein the first and the second bulk pick-up regions are physically spaced apart by a portion of the common source region; and
   a drain region formed in a second well region in the semiconductor substrate on a side of one of the first and second gate electrodes opposite the side of the gate electrode adjacent the common source region;
   wherein the first and second well regions are of opposite conductivity types.

10. The semiconductor device of claim 9, wherein the first and the second bulk pick-up regions are distributed along a straight line parallel to a gate width direction of the first and the second gate electrodes.

11. The semiconductor device of claim 9, wherein the first and the second bulk pick-up regions are connected to a first contact and a second contact, respectively, and wherein the common source region is connected to at least one contact.

12. The semiconductor device of claim 11, wherein the at least one contact and the first and the second contacts are in a same column extending in a gate width direction of the first and the second gate electrodes.

13. The semiconductor device of claim 9, wherein the first and the second bulk pick-up regions are each encircled by the common source region.

14. A semiconductor device comprising:
   a semiconductor substrate;
   a first gate electrode over the semiconductor substrate;
   a common source region in a first well region formed in the semiconductor substrate and having an edge substantially aligned to an edge of the first gate electrode;
   a first drain region in a second well region formed on an opposite side of the first gate electrode than the common source region;
   a first bulk pick-up region encircled by the common source region, wherein the first bulk pick-up region and the common source region are of opposite conductivity types; and
   a second gate electrode formed over the semiconductor substrate with the common source region between the first and second gate electrodes;
   wherein the first and second well regions are of opposite conductivity types and the first and second gate electrodes are electrically coupled together.

15. The semiconductor device of claim 14 further comprising:
   the common source region having an additional edge substantially aligned to an edge of the second gate electrode; and a second drain region on an opposite side of the second gate electrode than the common source region.

16. The semiconductor device of claim 15 comprising only one column of contacts between the first and the second gate electrodes, wherein the column extends in a gate width direction of the first and the second gate electrodes.

17. The semiconductor device of claim 15 comprises more than one column of bulk pick-up regions, wherein each of the bulk pick-up regions is encircled by the common source region, and wherein a total width of all bulk pick-up regions in a column is less than a width of the common source region.

18. The semiconductor device of claim 15, wherein the first and the second drain regions are electrically connected.

* * * * *